(12) United States Patent
Horesh et al.

(10) Patent No.: US 12,346,834 B2
(45) Date of Patent: Jul. 1, 2025

(54) FREE-FORM PRODUCTION BASED ON CAUSAL PREDICTIVE MODELS

(71) Applicants: International Business Machines Corporation, Armonk, NY (US); Johnson & Johnson Vision Care, Inc, Jacksonville, FL (US)

(72) Inventors: Lior Horesh, North Salem, NY (US); Chai W. Wu, Hopewell Junction, NY (US); Ramesh Natarajan, Pleasantville, NY (US); Raya Horesh, North Salem, NY (US); David Nahamoo, Great Neck, NY (US); Christopher Wildsmith, Jacksonville, FL (US); Michael Widman, Jacksonville, FL (US)

(73) Assignee: International Business Machines Corporation, Armonk, NY (US)

( * ) Notice: Subject to any disclaimer, the term of this patent is extended or adjusted under 35 U.S.C. 154(b) by 1455 days.

(21) Appl. No.: 15/876,718

(22) Filed: Jan. 22, 2018

(65) Prior Publication Data

US 2019/0228327 A1 Jul. 25, 2019

(51) Int. Cl.
*G06N 5/046* (2023.01)
*B33Y 10/00* (2015.01)
(Continued)

(52) U.S. Cl.
CPC ....... *G06N 5/046* (2013.01); *G05B 19/41865* (2013.01); *G06F 30/00* (2020.01);
(Continued)

(58) Field of Classification Search
None
See application file for complete search history.

(56) References Cited

U.S. PATENT DOCUMENTS 5,197,114 A * 3/1993 Skeirik ............... G06N 3/0427
706/23
6,388,592 B1 * 5/2002 Natarajan ............... H03M 7/30
706/45
(Continued)

FOREIGN PATENT DOCUMENTS

CN 110050230 A * 7/2019 ............. G03F 7/705

OTHER PUBLICATIONS

Leontaritis et al., "Input-output parametric models for non-linear systems. Part I: deterministic non-linear systems", Int'l J. of Control, received May 14, 1984; 1985 vol. 41, No. 2, pp. 303-328.
(Continued)

*Primary Examiner* — Akash Saxena
(74) *Attorney, Agent, or Firm* — Scully, Scott, Murphy & Presser, P.C.; Kelsey M. Skodje

(57) ABSTRACT

Methods and systems for determining control inputs to a manufacturing apparatus to manufacture a product are described. A processor may receive model data including initial state data indicating an initial state of an input material, a set of model control inputs, and target measurement data associated with a target product. The processor may learn a causal predictive model based on the target data. Each state of the causal predictive model may be based on an application of the model control inputs on a previous state of the causal predictive model. The processor may compare a final state of the causal predictive model with the target measurement data to determine a difference. The processor may determine, based on the difference, a set of control inputs to be assigned to one or more controls. The one or more controls may define a design of the manufacturing process of an end product.

17 Claims, 5 Drawing Sheets

(51) Int. Cl.
    *B33Y 50/00*         (2015.01)
    *G05B 19/418*      (2006.01)
    *G06F 30/00*        (2020.01)
    *G06F 30/20*        (2020.01)
    *G06F 30/27*        (2020.01)

(52) U.S. Cl.
    CPC .............. *G06F 30/20* (2020.01); *G06F 30/27* (2020.01); *B33Y 10/00* (2014.12); *B33Y 50/00* (2014.12)

(56) References Cited

U.S. PATENT DOCUMENTS

| | | | |
|---|---|---|---|
| 6,662,059 B2 | 12/2003 | Ito et al. | |
| 7,123,985 B2* | 10/2006 | Wildsmith | G05B 19/4097 264/1.32 |
| 7,451,065 B2* | 11/2008 | Pednault | G06K 9/6219 703/2 |
| 8,392,153 B2* | 3/2013 | Pednault | G06F 16/2465 703/2 |
| 8,732,627 B2* | 5/2014 | Baseman | G05B 19/41875 716/50 |
| 9,659,126 B2* | 5/2017 | Greiner | G06F 30/20 |
| 9,919,360 B2* | 3/2018 | Buller | G05B 19/4099 |
| 10,318,874 B1* | 6/2019 | Duncan | G06N 20/20 |
| 10,795,267 B2* | 10/2020 | Hansen | G06F 7/70 |
| 11,167,475 B2* | 11/2021 | Donovan | B29C 64/135 |
| 2005/0010319 A1* | 1/2005 | Patel | G05B 13/048 700/121 |
| 2010/0170202 A1* | 7/2010 | Bray | B65B 59/001 53/236 |
| 2012/0209580 A1* | 8/2012 | Tisne | G06F 30/23 703/9 |
| 2013/0123988 A1* | 5/2013 | Jariwala | G05B 11/01 700/266 |
| 2014/0336808 A1 | 11/2014 | Taylor et al. | |
| 2015/0055086 A1 | 2/2015 | Fonte et al. | |
| 2017/0206469 A1* | 7/2017 | Das | G05B 23/0254 |
| 2019/0056715 A1* | 2/2019 | Subramaniyan | G06F 30/27 |
| 2019/0129397 A1* | 5/2019 | Horiwaki | G05B 19/41885 |
| 2019/0205488 A1* | 7/2019 | Horesh | G06F 30/20 |

OTHER PUBLICATIONS

Leontaritis et al., "Input-output parametric models for non-linear systems. Part II: stochastic non-linear systems", Int'l J. of Control, received May 14, 1984; 1985 vol. 41, No. 2, pp. 329-344.
Brock et al., "A Test for Independence based on the Correlation Dimension". Econometric Reviews vol. 15, Issue 3, pp. 197-235, 1996. Published online: Dec. 23, 2010.
Sayers, "Free-form Lens Technology", Sep. 2014, Lenses,7 pages. https://www.2020mag.com/article/freeform-lens-technology-what-does-it-really-mean-to-your-patients-and-your-business.

* cited by examiner

FREE-FORM PRODUCTION BASED ON CAUSAL PREDICTIVE MODELS

FIELD

The present application relates generally to computers, and computer applications, and more particularly to computer-implemented methods and systems for free-form manufacturing.

BACKGROUND

Free-form manufacturing may provide instantaneous creation and materialization of objects as long as raw materials for their creation, appropriate free-form machinery, and designs are available. In some examples, free-form manufacturing may utilize physical modeling techniques. Physical modeling may rely upon an accurate understanding of the governing physical relations along with simulations of the manufacturing steps. In some examples, free-form manufacturing may be based on relatively complex manufacturing processes such as non-linear and non-local processes.

SUMMARY

In some examples, methods for determining control inputs to a manufacturing apparatus to manufacture a product are generally described. The methods may include receiving model data that includes initial state data, a set of model control inputs, and target measurement data. The initial state data may indicate an initial state of an input material to the manufacturing apparatus. The target measurement data may indicate target values of one or more attributes associated with a target product to be manufactured by the manufacturing apparatus. The methods may further include learning a causal predictive model based on the target data. Each state of the causal predictive model may correspond to a time, and each state of the causal predictive model may be based on an application of at least one of the received model control inputs on a previous state of the causal predictive model. The methods may further include comparing a final state of the causal predictive model with the target measurement data to determine a difference. The methods may further include determining, based on the difference, a set of control inputs to be assigned to one or more controls. The one or more controls may define a design of the manufacturing process of an end product.

In some examples, systems effective to determine control inputs to a manufacturing apparatus to manufacture a product are generally described. The systems may include a memory, a processor configured to be in communication with the memory, a predictive model module configured to be in communication with the processor and the memory, and a controls module configured to be in communication with the processor and the memory. The processor may be configured to receive model that includes initial state data, a set of model control inputs, and target measurement data. The initial state data may indicate an initial state of an input material to the manufacturing apparatus. The target measurement data may indicate target values of one or more attributes associated with a target product to be manufactured by the manufacturing apparatus. The predictive model module may be configured to learn a causal predictive model based on the target data. Each state of the causal predictive model may correspond to a time, and each state of the causal predictive model may be based on an application of at least one of the received model control inputs on a previous state of the causal predictive model. The controls module may be configured to compare a final state of the causal predictive model with the target measurement data to determine a difference. The controls module may be further configured to determine, based on the difference, a set of control inputs to be assigned to one or more controls. The one or more controls may define a design of the manufacturing process of an end product.

In some examples, computer program products for determining control inputs to a manufacturing apparatus to manufacture a product are generally described. The computer program product may include a computer readable storage medium having program instructions embodied therewith. The program instructions may be executable by a device to cause the device to receive model data that includes initial state data, a set of model control inputs, and target measurement data. The initial state data may indicate an initial state of an input material to the manufacturing apparatus. The target measurement data may indicate target values of one or more attributes associated with a target product to be manufactured by the manufacturing apparatus. The program instructions may be further executable by a device to cause the device to learn a causal predictive model based on the target data. Each state of the causal predictive model may correspond to a time, and each state of the causal predictive model may be based on an application of at least one of the received model control inputs on a previous state of the causal predictive model. The program instructions may be further executable by a device to cause the device to compare a final state of the causal predictive model with the target measurement data to determine a difference. The program instructions may be further executable by a device to cause the device to determine, based on the difference, a set of control inputs to be assigned to one or more controls. The one or more controls may define a design of the manufacturing process of an end product.

DETAILED DESCRIPTION

Briefly stated, methods and systems for determining control inputs to a manufacturing apparatus to manufacture a product are described. A system may receive model data including initial state data indicating an initial state of an input material, a set of model control inputs, and target measurement data associated with a target product. The system may learn a causal predictive model based on the target data. Each state of the causal predictive model may be based on an application of the model control inputs on a previous state of the causal predictive model. The system may compare a final state of the causal predictive model with the target measurement data to determine a difference. The system may determine, based on the difference, a set of control inputs to be assigned to one or more controls. The one or more controls may define a design of the manufacturing process of an end product.

Figure 1:
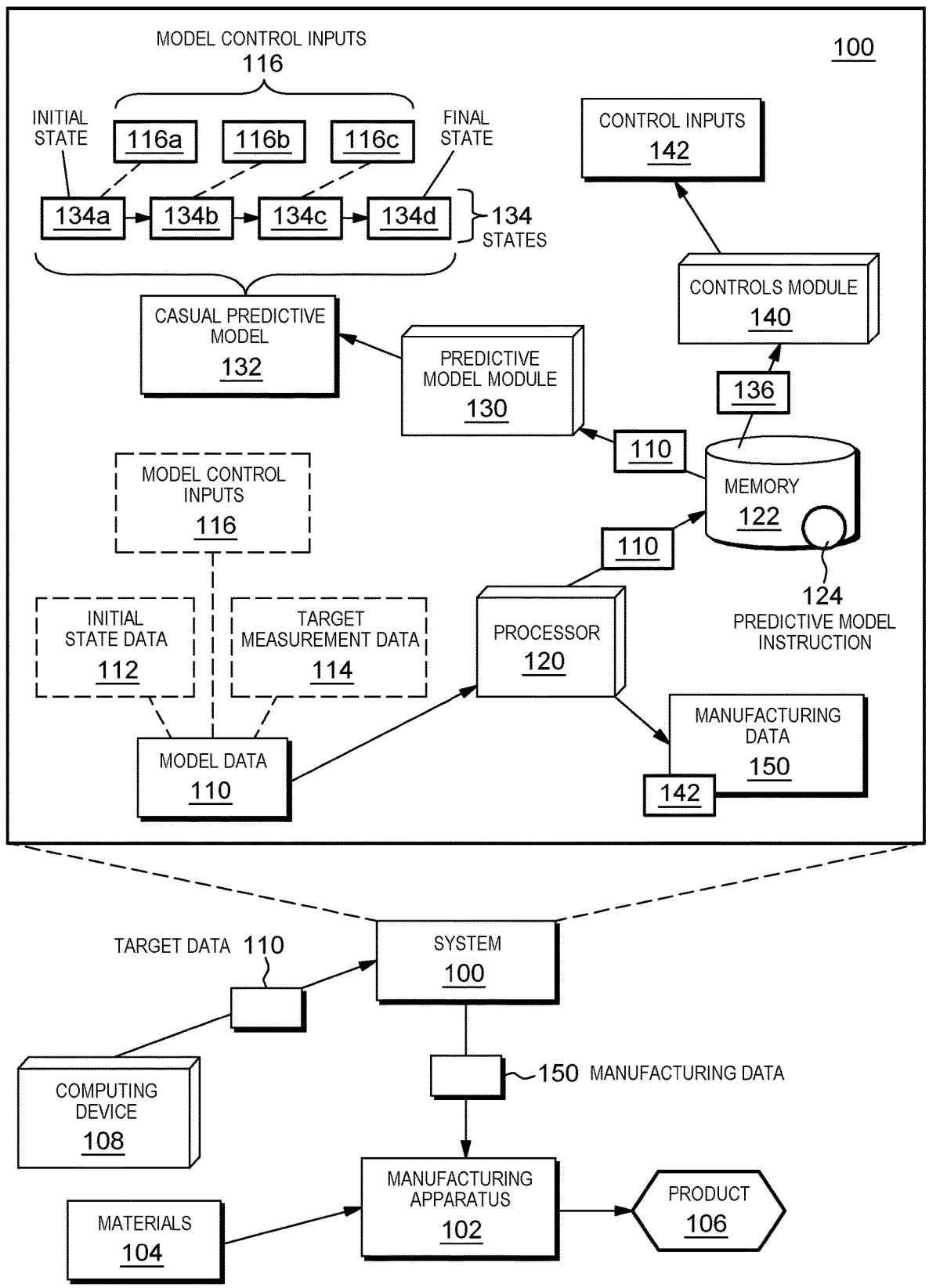
FIG. 1 illustrates an example computer system that can be utilized to implement free-form production based on causal predictive models.

FIG. 1 illustrates an example computer system 100 that can be utilized to implement free-form production based on causal predictive models, arranged in accordance with at least some embodiments described herein. In some examples, system 100 may be a system effective to facilitate free-form manufacturing of a product 106. In the example shown in FIG. 1, system 100 may be configured to be in communication with a computing device 108 and/or a manufacturing apparatus 102. Computing device 108 may be a desktop computer, laptop computer, cellular phone, smart phone, tablet computer, wearable devices, etc. Manufacturing apparatus 102 may be an apparatus including computing devices, machinery, and/or various mechanisms, etc., effective to manufacture one or more products by transforming materials 104. For example, manufacturing apparatus 102 may be an apparatus including light source, beam shapers, digital micromirror device, projection lens, etc., such that manufacturing apparatus 102 may manufacture free-form contact lenses (product 106) by polymerizing a slab of gel (materials 104).

System 100 may be a computer system, and may include a processor 120, a memory 122, a predictive model module 130, and/or a controls module 140. Processor 120, memory 122, predictive model module 130, and controls module 140 may be configured to be in communication with each other. In some examples, processor 120, memory 122, predictive model module 130, and controls module 140 may be housed, or distributed, in a same housing and/or a computer device. In some examples, processor 120, memory 122, predictive model module 130, and controls module 140 may be housed, or distributed, in two or more different housings and/or computer devices. For example, processor 120 and memory 122 may be distributed in a first device and predictive model module 130 and controls module 140 may be distributed in a second device different from the first device.

In another embodiment, processor 120, memory 122, predictive model module 130, and controls module 140 may each be hardware components or hardware modules of system 100. In some examples, predictive model module 130 and controls module 140 may each be a hardware component, or hardware modules, of processor 120. In some examples, processor 120 may be a central processing unit of a computer device. In some examples, processor 120 may control operations of predictive model module 130 and controls module 140. In some examples, predictive model module 130 and controls module 140 may each include electronic components, such as integrated circuits. In some examples, predictive model module 130 and controls module 140 may each be processors configured to perform respective operations. In some examples, predictive model module 130 and controls module 140 may each be an embedded system, such as programmable devices such as field-programmable-gate-array (FPGA), or other types of application specific integrated circuits (ASIC), etc. In some examples, predictive model module 130 and controls module 140 may each be software modules that may be implemented with processor 110.

Memory 122 may be configured to store a predictive model instruction 124. Predictive model instruction 124 may include one or more set of instructions to facilitate implementation of system 100. In some examples, predictive model instruction 124 may include instructions to apply regression methods, such as, to a set of model data (described below) received at system 100. In some examples, predictive model instruction 124 may indicate one or more objective functions, conditions, constraints, and/or parametric or non-parametric regularization terms, associated with an implementation of system 100 (described below). Processor 120, predictive model module 130, and controls module 140 may each retrieve predictive model instruction 124 from memory 122, and may each execute one or more portions of predictive model instruction 124 to facilitate implementation of system 100.

In an example, computing device 108 may send a request to system 100 to manufacture product 106. Computing device 108 may send model data 110 to system 100, where model data 110 may include data effective to indicate a target form of product 106. For example, model data 110 may include target measurement data 114 that indicates a target shape, size, measurements of various attributes such as modulus, coefficient of friction, wettability, etc., of a piece of contact lens to be manufactured by manufacturing apparatus 102. Model data 110 may further include initial state data 112 that indicates an initial state of materials 104 that may be inputted to manufacturing apparatus 102, such as values of shape, size, attributes such as modulus, coefficient of friction, wettability, etc. of materials 104. Model data 110 may further include a set of model control inputs 116 that may be applied to one or more states of predictive models (further described below). Each control input may include one or more values that may activate one or more controls associated with production of product 106 by manufacturing apparatus 102. For example, in examples where manufacturing apparatus 102 is configured to manufacture contact lenses, an example control may be application of ultraviolet (UV) micro-array sequence, and a corresponding control input may include values that may be input to a digital micro-array device to cause the digital micromirror device to output an UV array sequence in accordance with the corresponding control input. In some examples, model data 110 may further include indications of a model architecture, such as instructions indicating specific layers (e.g., input, hidden, output layers) of a process to manufacture product 106. In some examples, model data 110 may further include activation functions that may be used to convert an output from a first layer into an input for a second layer in the model architecture.

Processor 120 of system 100 may receive model data 110 and, in response, may store model data 110 in memory 122. Predictive model 130 may retrieve model data 110 from memory 122 and, in response, may learn, or may generate, a causal predictive model 132 based on model data 110. Causal predictive model 132 may be a predictive model that includes causal attributes, such as, representing states that are dependent on previous states of the predictive model. In an example, a predictive model may be causal if an output of the predictive model depends upon past input to the system. For example, a first input to the system may change a state of the predictive model. The predictive model may behave in a certain manner in response to a second input if the second input was received after the first input, and may behave in another manner if the second input was received prior to the first input. In an example, predictive model module 130 may apply one or more functions and/or techniques indicated by predictive model instruction 124 on model data 110 to learn causal predictive model 132. For example, predictive model module 130 may apply regression techniques on initial state data 112 and target measurement data 114, in combination with an application of model control inputs 116, to generate causal predictive model 132. Causal predictive model 132 may be at different states at different times, where each state may represent a condition of materials 104 at a corresponding time. In other words, causal predictive model 132 may go through a timed sequence of states. For example, causal predictive model may vary from an initial state 134a (which may be indicated by initial data 112), to state 134b, then from state 134b to state 134c, then from 134c to state 134d, where state 134d may be a final state of causal predictive model 132. Each state 134 may correspond to a time series, and each pair of states may indicate a change of causal predictive model 132 over a time interval. Each state of causal predictive model 132 may be a result of an application of a set of model control inputs 116 on a previous state of causal predictive model 132. For example, state 134b may be a result of an application of model control input 116a on initial state 134a, state 134c may be a result of an application of model control input 116b on initial state 134b, and final state 134d may be a result of an application of model control input 116c on initial state 134c.

In an example, target measurement data 114 may be associated with a target model (further described below) that may be an observable outcome from physical space, such as a result from previously manufactured products. For example, target measurement data 114 may include measurements associated with a free-form object that was previously manufactured by manufacturing apparatus 102. States 134 may include simulated states in a virtual space that may be determined by system 100 and based on an application of model control inputs 116 (further described below). In some examples, each state 134 may be a projection of causal predictive model 132 onto a measurable space, or a data space. Thus, system 100 may simulate states that may not be observable in the physical space to determine causal predictive model 132.

As will be described below, controls module 140 may be configured to analyze causal predictive model 132 and, based on the analysis, may determine one or more control inputs 142 that may be assigned to a set of controls to manufacture product 106. Processor 120 may generation manufacturing data 150 based on the determined control inputs 142 and, in response, may send manufacturing data 150 to manufacturing apparatus 102. Manufacturing data 150 may include a sequence of controls, and/or operations, to manufacture product 106, where the sequence of controls may be activated based on determined control inputs 142. Manufacturing apparatus 102 may manufacture product 106 based on manufacturing data 150. By prescribing determined control inputs 142 to a specific sequence of controls to manufacture product 106, a difference between measurements of product 106 and measurements indicated by target measurement data 114 may be reduced and/or minimized.

Predictive models 132 may be causal predictive models with multiple input sequences (hierarchy), along with hidden intermediate layers, and a final measurement. The control input at each layer may be integrated in a time-delayed manner, i.e., sequentially following the processing of the state from the previous time step. In some examples, the input time series may be constrained to be of low bit depth to account for situations where the control input is provided in binary or integer form. The initial state and control input (e.g., initial state data 112) are assumed to be known and only the measurement at the final stage of the process (e.g., target measurement data 114) is assumed to be observable.

Figure 2:
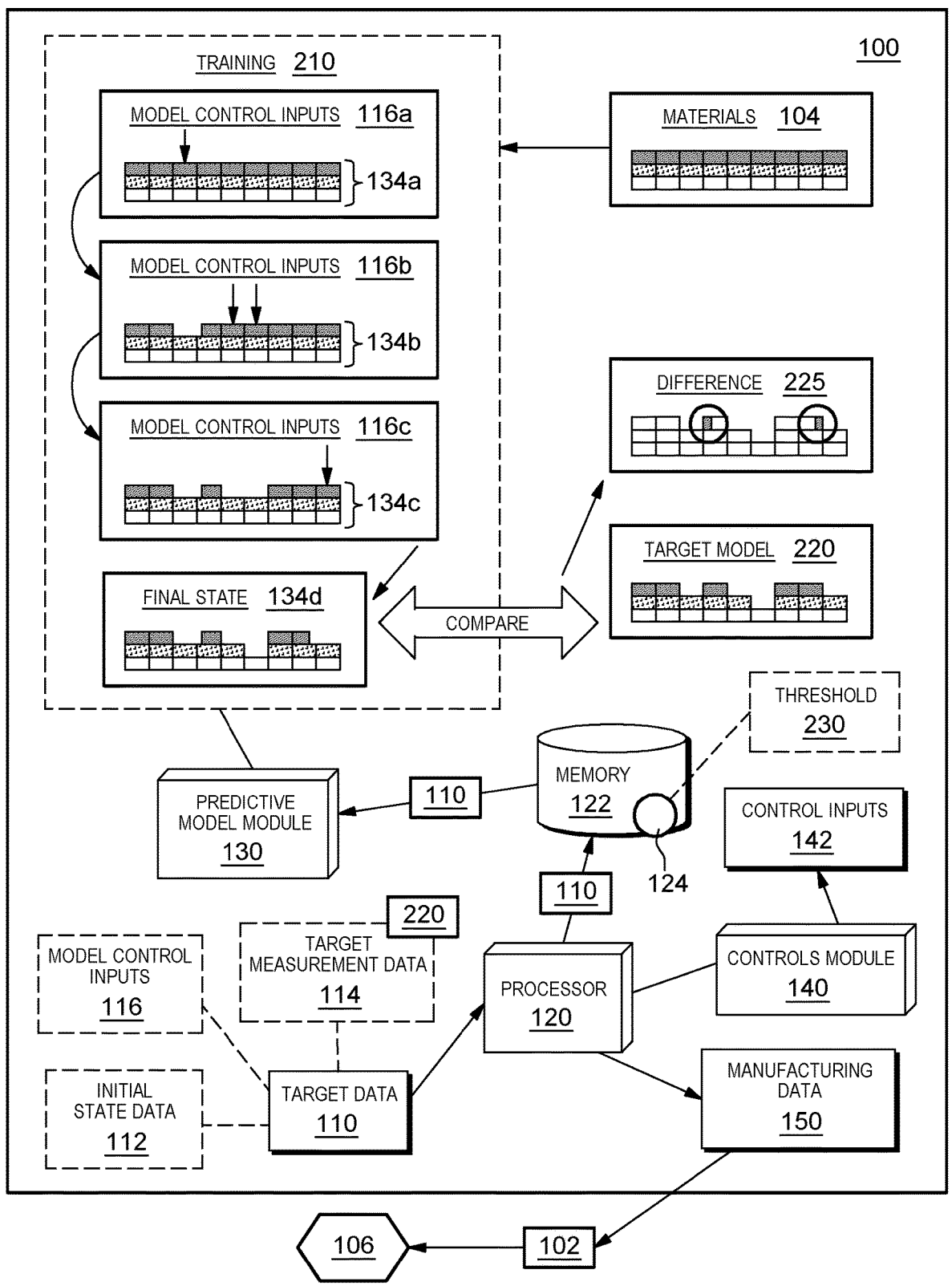
FIG. 2 illustrates the example computer system of FIG. 1 with additional detail relating to determination of causal predictive models.

FIG. 2 illustrates the example computer system of FIG. 1 with additional detail relating to determination of causal predictive models, arranged in accordance with at least some embodiments described herein. FIG. 2 is substantially similar to computer system 100 of FIG. 1, with additional details. Those components in FIG. 2 that are labeled identically to components of FIG. 1 will not be described again for the purposes of clarity.

Objectives, conditions and/or constraints may be set to determine causal predictive model 132. For example, given a set of predictive model inputs (e.g., initial state data 112), including controls (e.g., model control inputs 116 such as UV micro array sequence), and corresponding final output measurements (e.g., target measurement data 114 associated with an end product such as a manufactured lens), an objective may be to determine a set of solutions, or a function, that may represent a model (causal predictive model 132) that may minimize discrepancy between a simulated product and the target product while accounting for generalization error.

In an example, causal predictive model 132 may be determined by determining one or more solutions to the following objective function:

$$W, b = \underset{W, b \in C}{\operatorname{argmin}}\ \mu(F(s_T^j; W, b), m_T^j) + \alpha S(W, b)$$

where:

W, b may denote predictive model parameterization. For example, in recurrent deep neural networks, W, b may be a set of weight matrices $W=\{W_0, W_1, \ldots, W_k\}$ and a set of biases $b=\{b_1, b_2, \ldots, b_k\}$, respectively. In another example, in a Bayesian network, W, b may be associated with holding probabilities. In another example, for causal hidden Markov models, W, b may be associated with transition probabilities, C may denote a feasible set, such as permissible values for predictive model parameterization W, b. In some examples, C may be representing two distinct sets $C_W$ and $C_b$, such that there may be two separate feasible sets for W and b. The elements of C may be dependent on a functional form of the predictive model. For example, if W represents weights of a neural network of a given architecture, then a sensible choice for its feasible set may be to require that the real part of its eigenvalues are all non-negative. Such a choice may enforce stability of the predictive model and yield consistent results for new instances (e.g., generalizability), j may denote an index of the realization taken for training. For example, when the parametrization, W and b of the predictive model, F, are learned, multiple realizations of measurements of the final outcome, $m_T^j$, may be relied upon. As such, the multiple realizations, and corresponding states, $s_T^j$, may be indexed in order to perform further comparisons, μ may denote a distance measure that describes how similar and/or different are measurements at a final state $s_T$ to measurements $m_T$ of the target product, S may denote a regularization function, which may penalize model parameterization values of a pre-determined property or attribute, or represent physical constraints or preferences being incorporated into the objective function. For example, there may be a need to incorporate a preference in the objective function to indicate any physical properties that must include positive values (e.g., resistance), α may denote a regularization hyper parameter, which may represent preference or confidence that may be attributed based on prior knowledge or understanding of the underlying process.

The above objective function corresponds to an objective of minimizing the expression:

$$\mu(F(s_T^j; W, b), m_T^j) + \alpha S(W, b)$$

for values of W, b within the feasible set C, such that:

$$s_{t+1} = g(s_t, d_t; W, b), t = t_0, t_1, \ldots, T-1$$

where:
- $s_{t+1}$ denotes a state of causal predictive model 132 at time t+1,
- $s_t$ denotes a state of causal predictive model 132 at time t,
- d denotes a control input at time t,
- g denotes a model evolution, such that $g(s_t, d_t)$ denotes a model evolution at time t, and g is a function of state $s_t$ and control $d_t$. In some examples, g may also denote a non-linear function that may evolve a current state while accounting for the application of external controls,
- $t_0$ denotes an initial time,
- T denotes a final time, or the time of the final state.

In other words, the objective is to minimize the expression above under the condition that a states of causal predictive model 132 at a next time t+1 is equivalent to a revolution of the model g at a current time t.

Predictive model module 130 may apply regression techniques, which may be indicated by predictive model instruction 124, on the above objective function with initial state (e.g. initial state data 112), a final state (e.g., target measurement data 114), and model control inputs 116, being given, to determine solutions or a function to represent causal predictive model 132.

In an example, a state s of causal predictive model 132, may be denoted as:

$$s_{t+1} = g(s_t, d_t; W, b) + \eta_t$$

where $\eta_t$ denotes a state error.

Further, a measurement at final time T, $m_T$, may be denoted as:

$$m_T = F(s_T; W, b) + \epsilon$$

where:
- F denotes a measurement operator,
- ε denotes a measurement error.

Using the various notations described above, solutions to the above constrained optimization problem, determined by predictive model module 130, may include coefficients to define a function that may represent causal predictive model 132. In an example, a final state $s_T$ may be $g(s_{T-1}, d_{T-1})$, which indicates that the final state is a result of an application of a final control $d_{T-1}$ on a previous state $s_{T-1}$. Since a final state may be dependent on one or more previous states, a first final measurement based a first set of solutions may be different from a second final measurement based on a second set of solutions. In some examples, solutions to the above constrained optimization problem may involve sensor data and knowledge of the controls, which may facilitate identification of an optimal set of controls. The process may be relatively declarative than imperative, such that, in some examples, there may be no need to compare various candidate controls, and solution of the aforementioned problem may be determined based on application of various mathematical or computer programming techniques.

In an example shown in FIG. 2, predictive model module 130 may execute a training section (training 210) to learn causal predictive model 132 based on model data 110. Model data 110 may include a target model 220 to represent a target end product. Training 210 may begin with an application of model control inputs 116a on initial state 134a of materials 104. In the example, the arrows (as shown within boxes of model control inputs 116a, 116b, 116c) may represent an application of controls, such as directing UV array sequences, to shape, deform, or alter materials 104. Continuing with the example, predictive model module 130 may apply model control inputs 116b on materials 104 to transform from state 134b to state 134c. Similarly, predictive model module 130 may apply model control inputs 116c on materials 104 to transform from state 134c to state 134d. Predictive model module 130 may determine that state 134d may be a final state, such as by determining that model control inputs 116c maybe a last model control input given by model data 110. In some examples, predictive model module 130 may store data associated with final state 134d in memory 122.

Controls module 140 may compare a projection of final state 134d of causal predictive model 132 onto a measurable space, or a data space, indicated by causal predictive model 132 with target model 220 to determine a measure of, or a value representative of, the difference 225, where difference 225 may be a difference between the projection of final state 134d of causal predictive model 132 and target model 220. In an example, controls module 140 may compare difference in coefficient of friction with threshold 230, and if the difference does not comply with threshold 230, may determine that final state 134d is significantly different from target model 220. For example, threshold 230 may indicate "5%", and if the difference between the coefficients of friction is more than "5%", then predictive model module 130 may determine that final state 134d is significantly different from target model 220. When differences between a final state of causal predictive model 132 is comparable to target model 220, controls module 140 may determine to use the set of solutions that corresponds to the causal predictive model leading to the compliant difference as control inputs (control inputs 142) to be assigned to controls to produce product 106.

Upon determining control inputs 142, controls module 140 may notify processor 120 of the determination. Processor 120 may generate manufacturing data 150 that may indicate assignment of control inputs 142 to a set of controls to manufacture product 106. Processor 120 may send manufacturing data 150 to manufacturing apparatus 102, such that manufacturing apparatus 102 may generate product 106 based on control inputs 142 and based on the instruction indicated by manufacturing data 150. By manufacturing product 106 based on the selected controls, a discrepancy between the end product (product 106) and a target product (target model 220) may be minimized due to the determination of control inputs 142 based on a minimization of an objective function related to a difference between a simulated product and a target product.

In some examples, the predictive models may be constructed offline, and may be used as an online predictive model to provide rapid prototyping of designs. Alternatively, the predictive models may also be updated dynamically in an adaptive manner based on new measurement data. The predictive models may model complex manufacturing processes by means of data-driven adaptation as well as physics inspired causality considerations. For example, each application of controls on a state of the material (or on a predictive model) may cause reactions from the material. For example, an application of a particular type of controls under a particular temperature environment may cause the material to deform in a particular way. For example, applications of a same set of controls in different sequence may cause affect particular attributes of the end product. Predictive model module may be configured to determine predictive models based upon a training set of control inputs (designs) and entailed targets. Once training is concluded, the causal predictive models can be used for determining an optimal set of controls for complex manufacturing processes. As such, a system in accordance with the present disclosure incorporate physically inspired principles (e.g., causality) with data driven approaches to determine a model that links between the input controls and the resulted manufactured item. Some examples of physically inspired principles may include principles of conservation, notions of simplicity, symmetry, etc.

In one embodiment, a set of suitable designs and corresponding measured targets are assumed to be given. An adaptive predictive model (e.g. neural network based) is constructed, yet, rather than the conventional input layer, hidden layers and output layers, a sequence of binary/low bit depth inputs are provided to the model at various time step instances. The model can be assumed static (with relatively high capacity) or alternatively dynamic (with low capacity per time step). For the former case, the same model interacts with the inputs of various time steps. Lastly only after the last time step input has been provided and processed final output is obtained.

Figure 3:
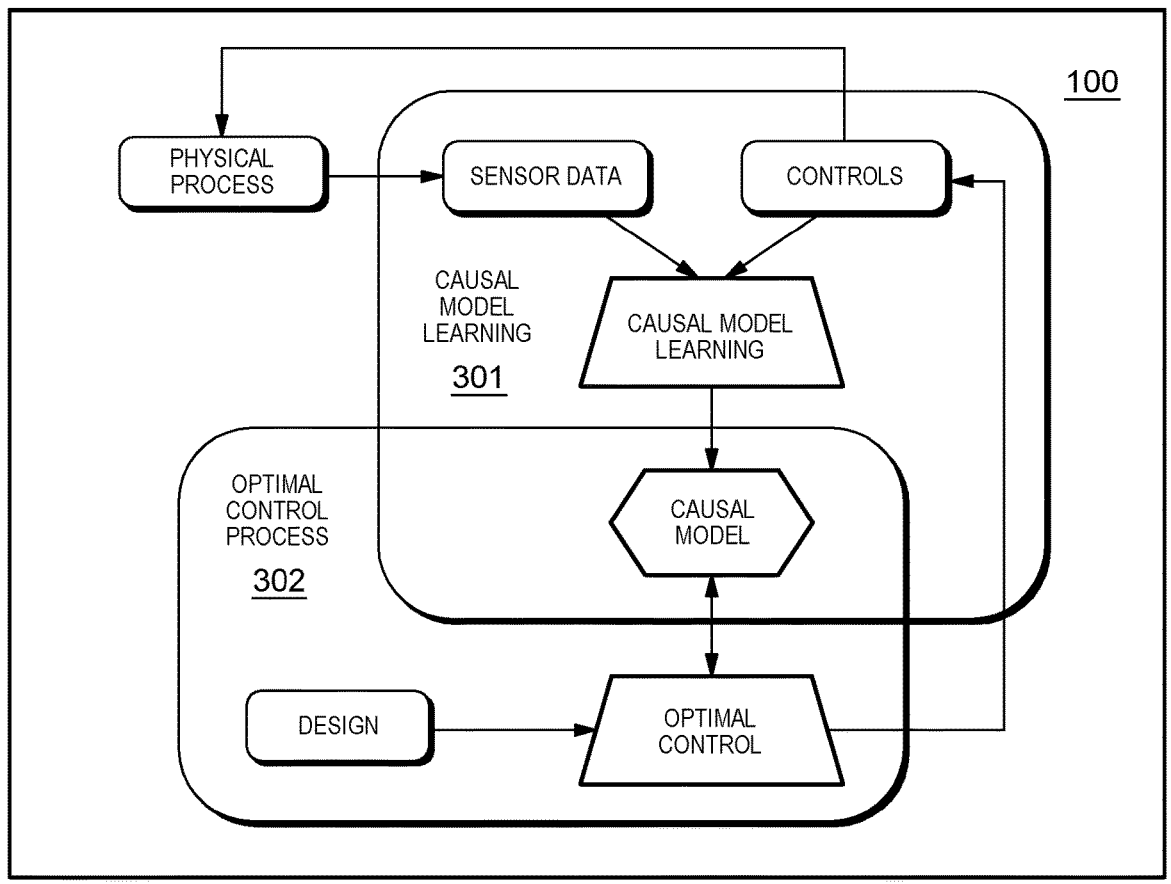
FIG. 3 illustrates an embodiment of the example computer system of FIG. 1 relating to free-form production based on causal predictive models.
Figure 3:
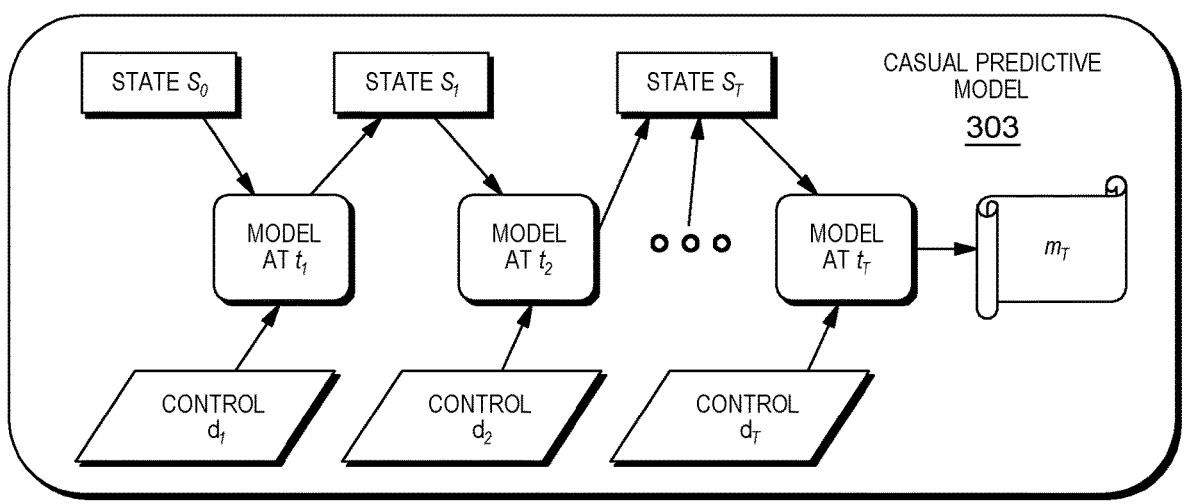

FIG. 3 illustrates an embodiment of the example computer system of FIG. 1 relating to free-form production based on causal predictive models, arranged in accordance with at least some embodiments described herein. FIG. 3 is substantially similar to computer system 100 of FIG. 1 and FIG. 2, with additional details. Those components in FIG. 3 that are labeled identically to components of FIG. 1 and FIG. 2 will not be described again for the purposes of clarity.

As shown in FIG. 3, system 100 may be implemented with one or more components and/or processes to determine predictive models and select optimal controls to manufacture a product. In an example embodiment, an implementation of system 100 may include a causal model learning process 301 and/or an optimal control process 302.

Model learning process 301 may include implementing causal model learning based on sensor data and controls. Sensor data may include data generated by one or more sensors as a result of detecting one or more physical manufacturing processes. Controls being input into the causal model learning processes may be controls selected optimal control process 302, which will be described below.

In an example, an output of causal model learning 301 may include a causal predictive model. Optimal control process 302 may analyze the causal predictive model output from causal model learning process 301, along with a set of design parameters and conditions, to determine a set of optimal control inputs. Optimal control process 302 may output the selected optimal control inputs, and the determined optimal control inputs may be feedback into causal model learning process 301 as model control inputs. Causal model learning process 301 may utilize the optimal control inputs received from optimal control process 302 to update, modify, improve, adjust, one or more causal predictive models that may be output by causal model learning process 301. As such, an implementation of system 100 may resemble a control system where causal model learning process 301 may generate outputs that may also act as inputs to optimal control process 302, and vice versa.

An example flow chart 303 is shown in FIG. 3 to illustrate a causal predictive model determined by causal model learning process 301. In flow chart 303, an initial state of a causal predictive model may be shown as $s_0$, and the initial state and control inputs are assumed to be known and only the measurement at the final stage of the process is assumed to be observable. A first set of control inputs $d_1$ may be applied to initial state $s_0$ to determine a first intermediate state $s_1$ of causal predictive model at time $t_1$. A second set of control inputs $d_2$ may be applied to state $s_1$ to determine a second intermediate state $s_2$ of causal predictive model at time $t_2$. The process may continue until a set of controls $d_T$ at a final time T is applied to a model of a state $s_T$, such that final state of causal predictive model at time $t_T$ is determined. Final measurements $m_T$ may be determined from the final state at time $t_T$. Measurements $m_T$ at final state $s_T$ may be compared with a target model to determine a set of optimal control inputs.

Free-form manufacturing is becoming broadly used, economic projections indicate its wide spread both in industrial and the consumer sectors. In some examples, depending upon the materials as well as the process, the manufactured target may differ from its intended or required form (e.g., shape). Manufacturing discrepancies in the end-product may emerge due to process variations (e.g., temp, ambient pressure, UV exposure . . . ) or due to requirements misspecification. For example, in a lens manufacturing process, a slab of gel is polymerized by a sequence of UV radiation rays arriving from a digital micro mirror array device, or a digital micromirror device. While one can potentially attempt to converge to a desired design or final requirements by trial and error, such an approach is wasteful in terms of time and materials. Therefore, typical formation process is non-linear and non-local, rendering naïve point-wise adjustment as slow and of no convergence guarantees.

A system in accordance with the present disclosure may benefit industries that utilizes free-form manufacturing, and may offer means for the design of 3D objects in complex (e.g., causal, non-linear, non-local) manufacturing process and varying environments. A system in accordance with the present disclosure may be implemented using a physically inspired dynamic model control along with a data driven approach. For example, predictive models may be constructed by first principles (e.g., physical modeling using ODEs or PDEs, etc.) or alternatively by physics-agnostic models using data-driven approaches (e.g., neural networks, GMMs, regression models, etc.). Since the manufacturing process is time-dependent, the causal order in which the controls, which may be selected by implementing a system in accordance with the present disclosure, are applied plays a significant role in the resulted output. Data driven approaches are generic, and typically only require data in the form of input process and specification data, and corresponding outputs from the manufacturing process. By prescribing the controls that define the design of the manufacturing process through a causal predictive model, manufacturing time and costs may be reduced. Further, the ability to control complex processes shall extend upon the functionality and applicability of current raw materials and manufacturing procedures.

For example, current contact lenses technology allow only for correction of 1st order aberrations (i.e. diopter and astigmatism), and corrections are typically applied in discrete jumps of 0.25 units. Instead, individualized (patient specific) contact lenses that account for high-order aberrations through free-form manufacturing may offer superior visual acuity. The process of free-form contact lenses manufacturing are complex and time consuming, and oftentimes due to lack of knowledge regarding the process, not even applicable. The physics-agnostic nature of the contact lens manufacturing process are sometimes difficult to generalize. In the context of free-form contact lens design, a system in accordance with the present disclosure may offer attainment of high fidelity predictions of the end lens as well as improved prescription of controls.

A system in accordance with the present disclosure may also improve medical applications, such as production of 3D models of various anatomical parts for prototyping or for implants. For example, in stereo lithography systems for medical implants, a process may begin with medical scans such as MRI, CT scan, or scans by other medical imaging devices. The scans may be processed, and regions of interest may be extracted such that a sequence for 3D modeling may be created. The system in accordance with the present disclosure may be implemented to create causal predictive 3D models based on the scans, and such that control sequences may be generated based on the causal predictive 3D models. As such, accurate 3D models may be produced based on the generated controls from the causal predictive 3D models.

Figure 4:
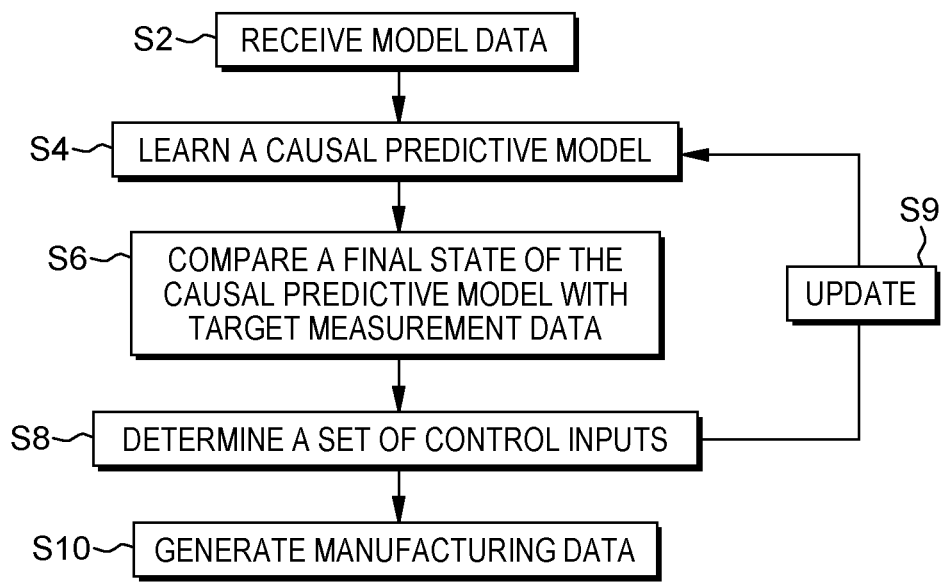
FIG. 4 illustrates a flow diagram for an example process to implement free-form production based on causal predictive models.

FIG. 4 illustrates a flow diagram for an example process to implement free-form production based on causal predictive models, arranged in accordance with at least some embodiments presented herein. The process in FIG. 4 could be implemented using, for example, computer system 100 discussed above. An example process may include one or more operations, actions, or functions as illustrated by one or more of blocks S2, S4, S6, S8, S9, and/or S10. Although illustrated as discrete blocks, various blocks may be divided into additional blocks, combined into fewer blocks, or eliminated, depending on the desired implementation.

Processing may begin at block S2, where a processor may receive model data that includes initial state data, a set of model control inputs, and target measurement data. The initial state data may indicate an initial state of an input material to the manufacturing apparatus. The target measurement data may indicate target values of one or more attributes associated with a target product to be manufactured by the manufacturing apparatus.

Processing may continue from block S2 to block S4. At block S4, the processor may learn a causal predictive model based on the target data. Each state of the causal predictive model may correspond to a time, and each state of the causal predictive model may be based on an application of at least one of the received model control inputs on a previous state of the causal predictive model.

Processing may continue from block S4 to block S6. At block S6, the processor may compare a final state of the causal predictive model with the target measurement data to determine a difference.

Processing may continue from block S6 to block S8. At block S8, the processor may determine a set of control inputs to be assigned to one or more controls. The one or more controls may define a design of the manufacturing process of an end product.

In some examples, processing may continue from block S8 to block S9. At block S9, the processor may update the causal predictive model with use of the determined set of control inputs.

Processing may continue from block S8 to block S10. At block S10, the processor may generate manufacturing data based on the determined set of control inputs. The manufacturing data may indicate an application sequence of one or more determined control inputs to manufacture the end product. The processor may send the manufacturing data to the manufacturing apparatus in order for the manufacturing apparatus to produce the end product based on the determined set of control inputs.

Figure 5:
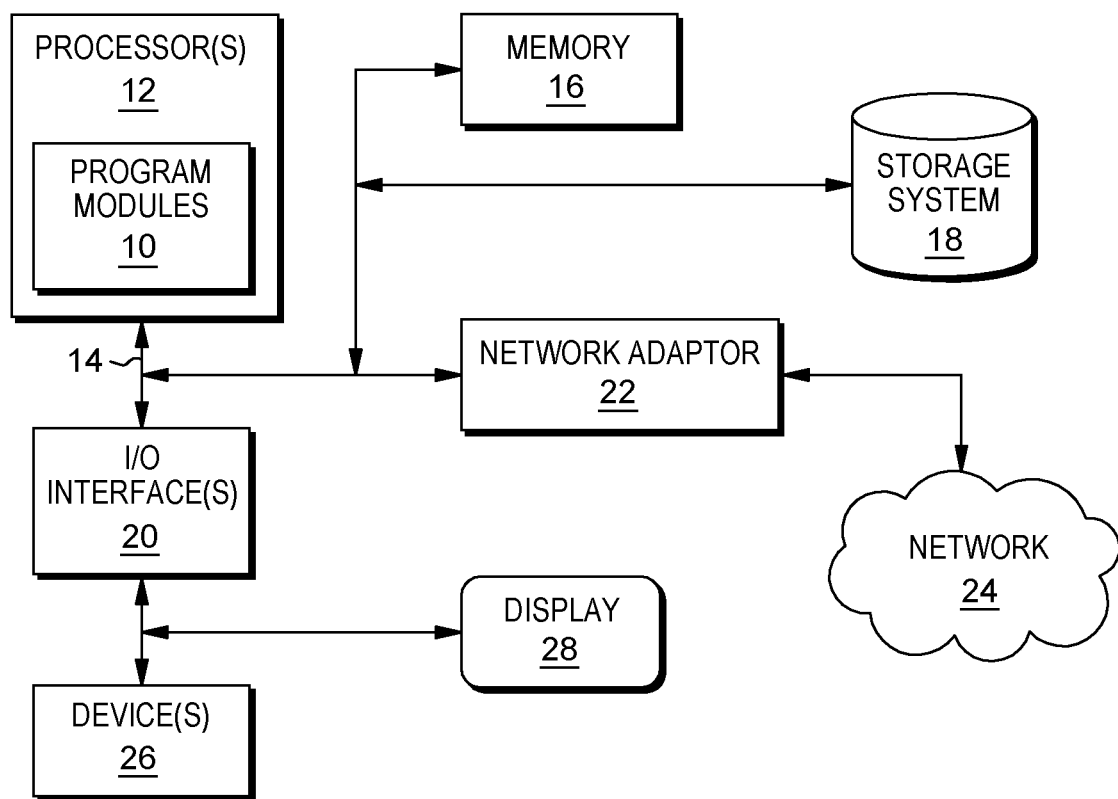
FIG. 5 is an exemplary block diagram of a computer system in which processes involved in the system, method, and computer program product described herein may be implemented.

FIG. 5 illustrates a schematic of an example computer or processing system that may implement any portion of computer system 100, processor 120, memory 122, predictive model module 130, controls module 140, systems, methods, and computer program products described herein in one embodiment of the present disclosure. The computer system is only one example of a suitable processing system and is not intended to suggest any limitation as to the scope of use or functionality of embodiments of the methodology described herein. The processing system shown may be operational with numerous other general purpose or special purpose computer system environments or configurations. Examples of well-known computer systems, environments, and/or configurations that may be suitable for use with the processing system may include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

The computer system may be described in the general context of computer system executable instructions, such as program modules, being executed by a computer system. Generally, program modules may include routines, programs, objects, components, logic, data structures, and so on that perform particular tasks or implement particular abstract data types. The computer system may be practiced in distributed cloud computing environments where tasks are performed by remote processing devices that are linked through a communications network. In a distributed cloud computing environment, program modules may be located in both local and remote computer system storage media including memory storage devices.

The components of computer system may include, but are not limited to, one or more processors or processing units 12, a system memory 16, and a bus 14 that couples various system components including system memory 16 to processor 12. The processor 12 may include a software module 10 that performs the methods described herein. The module 10 may be programmed into the integrated circuits of the processor 12, or loaded from memory 16, storage device 18, or network 24 or combinations thereof.

Bus 14 may represent one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system may include a variety of computer system readable media. Such media may be any available media that is accessible by computer system, and it may include both volatile and non-volatile media, removable and non-removable media.

System memory 16 can include computer system readable media in the form of volatile memory, such as random access memory (RAM) and/or cache memory or others. Computer system may further include other removable/non-removable, volatile/non-volatile computer system storage media. By way of example only, storage system 18 can be provided for reading from and writing to a non-removable, non-volatile magnetic media (e.g., a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 14 by one or more data media interfaces.

Computer system may also communicate with one or more external devices 26 such as a keyboard, a pointing device, a display 28, etc.; one or more devices that enable a user to interact with computer system; and/or any devices (e.g., network card, modem, etc.) that enable computer system to communicate with one or more other computing devices. Such communication can occur via Input/Output (I/O) interfaces 20.

Still yet, computer system can communicate with one or more networks 24 such as a local area network (LAN), a general wide area network (WAN), and/or a public network (e.g., the Internet) via network adapter 22. As depicted, network adapter 22 communicates with the other components of computer system via bus 14. It should be understood that although not shown, other hardware and/or software components could be used in conjunction with computer system. Examples include, but are not limited to: microcode, device drivers, redundant processing units, external disk drive arrays, RAID systems, tape drives, and data archival storage systems, etc.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for determining control inputs to a manufacturing apparatus to manufacture a free-form product from a single piece of free-form input material, the method comprising:
   receiving, by a processor in a system, model data from a computing device, the model data including:
      initial state data that indicates an initial state of a single piece of free-form input material being inputted to the manufacturing apparatus,
      a set of model control inputs, and
      target measurement data that includes measurements associated with a free-form object previously manufactured by the manufacturing apparatus from the single piece of free-form input material, wherein the measurements associated with the free-form object previously manufactured by the manufacturing apparatus are set as target values of one or more attributes associated with a target free-form product to be manufactured by the manufacturing apparatus;
   generating, by the processor in the system, a causal predictive model based on the initial state data, the set of model control inputs, and the target measurement data, wherein the causal predictive model defines a plurality of states varying from the initial state of the single piece of free-form input material to a final state based on a sequence of the set of model control inputs, each state of the causal predictive model simulating a condition of the single piece of free-form input material at a time t, each state of the causal predictive model subsequent to the initial state being a result of an application of at least one model control input of the set of model control inputs on a state of the causal predictive model at a previous time t−1;
   comparing, by the processor in the system, measurements of a projection of the final state of the causal predictive model with measurements among the target measurement data to determine at least one difference between the target free-form product and the projection of the final state;
   determining, by the processor in the system, whether the at least one difference between the target free-form product and the projection of final state is within a predefined threshold;
   in response to determining that the at least one difference between the target free-form product and the projection of the final state is within the predefined threshold, determining, by the processor in the system, at least one manufacturing control input for manufacturing the free-form product from the single piece of free-form input material;
   generating, by the processor in the system, manufacturing data based on the at least one manufacturing control input; and
   sending, by the processor in the system, the manufacturing data to the manufacturing apparatus, for manufacturing the free-form product from the single piece of free-form input material.

2. The method of claim 1, further comprising:
   determining, by the processor in the system, the at least one difference between the target free-form product and the projection of final state is outside of the predefined threshold; and
   in response to determining the at least one difference between the target free-form product and the projection of final state is outside of the predefined threshold, determining a new set of manufacturing control inputs.

3. The method of claim 1, wherein learning the causal predictive model includes determining one or more solutions to minimize an objective function relating to the at least one difference between the target free-form product and the projection of final state wherein the one or more solutions include coefficients defining a function that represents the causal predictive model.

4. The method of claim 3, wherein the objective function is based on:
- a set of predictive model parameterization;
- a set of realizations associate with the measurements of the final state of causal predictive model;
- a regularization function that represents physical constraints or preferences being incorporated into the objective function; and
- a regularization hyper parameter that represents a confidence attributed based on prior knowledge of a manufacturing process to manufacture the product.

5. The method of claim 1, wherein the model data includes a target model that represents an observable outcome of a manufacturing process to manufacture the product in a physical space, the initial state is observable in the physical space, and the states of the causal predictive model are unobservable in the physical space.

6. The method of claim 1, further comprising:
- updating the set of model control inputs with the at least one manufacturing control input being used for generating the manufacturing data; and
- updating the causal predictive model based on the updated set of model control inputs.

7. The method of claim 1, further comprising constraining the model control inputs to low bit depth in response to the model control input being in binary or integer form.

8. A system effective to determine control inputs to a manufacturing apparatus to manufacture a free-form product from a single piece of free-form input material, the system comprises:
- a memory;
- a processor configured to be in communication with the memory;
- a predictive model module configured to be in communication with the processor and the memory;
- a controls module configured to be in communication with the processor and the memory, wherein:
  - the processor is configured to receive model data that includes:
    - initial state data that indicates an initial state of a single piece of free-form input material being inputted to the manufacturing apparatus,
    - a set of model control inputs, and
    - target measurement data that includes measurements associated with a free-form object previously manufactured by the manufacturing apparatus from the single piece of free-form input material, wherein the measurements associated with the free-form object previously manufactured by the manufacturing apparatus are set as target values of one or more attributes associated with a target free-form product to be manufactured by the manufacturing apparatus;
  - the predictive model module is configured to generate a causal predictive model based on the initial state data, the set of model control inputs, and the target measurement data, wherein the causal predictive model defines a plurality of states varying from the initial state of the single piece of free-form input material to a final state based on a sequence of the set of model control inputs, each state of the causal predictive model simulating a condition of the single piece of free-form input material at a time t, each state of the causal predictive model being a result of an application of at least one model control input of the set of model control inputs on a state of the causal predictive model at a previous time t−1;
  - the controls module is configured to:
    - compare measurements of a projection of the final state of the causal predictive model with measurements among the target measurement data to determine at least one difference between the target free-form product and the projection of the final state;
    - determine whether the at least one difference between the target free-form product and the projection of final state is within a predefined threshold;
    - in response to the determination that the at least one difference between the target free-form product and the projection of the final state is within the predefined threshold, determine at least one manufacturing control input for manufacturing the free-form product from the single piece of free-form input material; and
  - the processor is further configured to:
    - in response to a determination to use the sequence of the set of model control inputs, generating manufacturing data using the at least one manufacturing control inputs; and
    - send the manufacturing data to the manufacturing apparatus for manufacturing the free-form product from the single piece of free-form input material.

9. The system of claim 8, wherein the controls module is further configured to:
- determine the at least one difference between the target free-form product and the projection of final state is outside of the predefined threshold; and
- in response to the determination that the at least one difference between the target free-form product and the projection of final state is outside of the predefined threshold, determine a new set of manufacturing control inputs.

10. The system of claim 8, wherein to learn the causal predictive model, the predictive model module is further configured to determine one or more solutions to minimize an objective function relating to the at least one difference between the target free-form product and the projection of final state, wherein the one or more solutions include coefficients defining a function that represents the causal predictive model.

11. The system of claim 10, wherein the objective function is based on:
- a set of predictive model parameterization;
- a set of realizations associate with the measurements of the final state of causal predictive model;
- a regularization function that represents physical constraints or preferences being incorporated into the objective function; and
- a regularization hyper parameter that represents a confidence attributed based on prior knowledge of a manufacturing process to manufacture the product.

12. The system of claim 8, wherein the model data includes a target model that represents an observable outcome of a manufacturing process to manufacture the product in a physical space, the initial state is observable in the physical space, and the states of the causal predictive model are unobservable in the physical space.

13. The system of claim 8, wherein the controls module is further configured to send at least one manufacturing control input to the predictive model module, and wherein the predictive model module is further configured to:
- update the set of model control inputs with the at least one manufacturing control input being used for generating the manufacturing data; and update the causal predictive model based on the updated set of model control inputs.

14. The system of claim 8, wherein the processor is further configured to constrain the model control inputs to low bit depth in response to the model control input being in binary or integer form.

15. A computer program product for determining control inputs to a manufacturing apparatus to manufacture a free-form product from a single piece of free-form input material, the computer program product comprising a computer readable storage medium having program instructions embodied therewith, the program instructions executable by a device to cause the device to:
receive model data that includes:
initial state data that indicates an initial state of a single piece of free-form input material being inputted to the manufacturing apparatus,
a set of model control inputs, and
target measurement data that includes measurements associated with a free-form object previously manufactured by the manufacturing apparatus from the single piece of free-form input material, the measurements associated with the free-form object previously manufactured by the manufacturing apparatus are being set as target values of one or more attributes associated with a target product to be manufactured by the manufacturing apparatus;
generate a causal predictive model based on the initial state data, the set of model control inputs, and the target measurement data, wherein the causal predictive model defines a plurality of states varying from the initial state of the single piece of free-form input material to a final state based on a sequence of the set of model control inputs, each state of the causal predictive model simulating a condition of the single piece of free-form input material at a time t, each state of the causal predictive model subsequent to the initial state being a result of an application of at least one model control input of the set of model control inputs on a state of the causal predictive model at a previous time t−1;
compare final state of the causal predictive model with measurements among the target measurement data to determine at least one difference between the target free-form product and the projection of final state;
determine whether the at least one difference between the target free-form product and the projection of final state is within a predefined threshold;
in response to determining that the at least one difference between the target free-form product and the projection of the final state is within the predefined threshold, determine at least one manufacturing control input for manufacturing the free-form product from the single piece of free-form input material;
generate manufacturing data based on the at least one manufacturing control input; and
send the manufacturing data to the manufacturing apparatus, for manufacturing the free-form product from the single piece of free-form input material.

16. The computer program product of claim 15, wherein the program instructions are further executable by the device to cause the device to learn the causal predictive model by determination of one or more solutions to minimize an objective function relating to the at least one difference between the target free-form product and the projection of final state, wherein the one or more solutions include coefficients defining a function that represents the causal predictive model.

17. The computer program product of claim 15, wherein the program instructions are further executable by the device to cause the device to:
update the set of model control inputs with the at least one manufacturing control input being used for generating the manufacturing data; and
update the causal predictive model based on the updated set of model control inputs.

\* \* \* \* \*